US011063789B2

(12) United States Patent
Shuvalov (10) Patent No.: US 11,063,789 B2
(45) Date of Patent: Jul. 13, 2021

(54) GALVANIC ISOLATION CIRCUIT (71) Applicant: NXP B.V., Eindhoven (NL)

(72) Inventor: Denis Sergeevich Shuvalov, Munich (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/802,862

(22) Filed: Feb. 27, 2020

(65) Prior Publication Data
US 2020/0313934 A1 Oct. 1, 2020

(30) Foreign Application Priority Data
Mar. 29, 2019 (EP) .................................. 19166177

(51) Int. Cl.
*H04L 25/02* (2006.01)
*H04B 10/40* (2013.01)
*H04L 25/49* (2006.01)
*H05K 1/02* (2006.01)

(52) U.S. Cl.
CPC ......... *H04L 25/0266* (2013.01); *H04B 10/40* (2013.01); *H04L 25/4917* (2013.01); *H05K 1/0231* (2013.01)

(58) Field of Classification Search
CPC . H04L 25/0266; H04L 25/4917; H04B 10/40; H05K 1/0231; H03H 7/01; H03H 7/0115; H01M 10/4207; H01M 10/4257; H01M 10/48; H01M 2010/4271; H01M 2010/4278
See application file for complete search history.

(56) References Cited

U.S. PATENT DOCUMENTS

| 5,615,091 A * | 3/1997 | Palatnik ................. H01F 19/08 336/198 |
| 6,023,202 A | 2/2000 | Hill |
| 6,124,756 A * | 9/2000 | Yaklin .............. H03K 19/01759 327/564 |
| 9,473,329 B1 * | 10/2016 | Edwards ............. H04L 25/0268 |
| 2001/0010502 A1 * | 8/2001 | Scott ....................... H04L 25/06 341/143 |
| 2006/0055379 A1 | 3/2006 | Yamamoto et al. |

(Continued)

FOREIGN PATENT DOCUMENTS

EP 1168804 A2 1/2002

OTHER PUBLICATIONS

NXP Semiconductors, "MC33771B_SDS, Battery cell controller IC," Short data sheet: technical data, Rev. 5.0, May 2, 2018, 29 pages.

(Continued)

*Primary Examiner* — Vineeta S Panwalkar (57) ABSTRACT

A galvanic isolation circuit comprising: a galvanic isolator having a first side and a second side; a first communication link connected to the first side of the galvanic isolator and connectable to a first transceiver a second communication link connected to the second side of the galvanic isolator and connectable to a second transceiver; a first reference terminal connectable to the first transceiver; a second reference terminal connectable to the second transceiver; and an AC short capacitor connected between the first reference terminal and the second reference terminal.

12 Claims, 8 Drawing Sheets

(56) References Cited

U.S. PATENT DOCUMENTS

2010/0284452 A1 11/2010 Allen
2011/0289248 A1* 11/2011 Djabbari ............ G06F 13/4256
710/110

OTHER PUBLICATIONS

Lorentz et al., "Novel Cost-Efficient Contactless Distributed Monitoring Concept for Smart Battery Cells", 2012 IEEE International Symposium on Industrial Electronics (ISIE), May 28, 2012, pp. 1342-1347.

* cited by examiner

GALVANIC ISOLATION CIRCUIT

FIELD

The present disclosure relates to a galvanic isolation circuit for use in a communication interface, in particular for use with battery management systems.

SUMMARY

According to a first aspect of the present disclosure there is provided a galvanic isolation circuit comprising:
a galvanic isolator having a first side and a second side;
a first communication link connected to the first side of the galvanic isolator and connectable to a first transceiver;
a second communication link connected to the second side of the galvanic isolator and connectable to a second transceiver;
a first reference terminal connectable to the first transceiver;
a second reference terminal connectable to the second transceiver; and
an AC short capacitor connected between the first reference terminal and the second reference terminal.

Such a galvanic isolation circuit can advantageously: (i) reduce the complexity and component requirements of EMI filter circuitry; and/or (ii) reduce the voltage tolerance requirements of the transceivers.

In one or more embodiments the AC short capacitor may be a discrete capacitor.

In one or more embodiments the galvanic isolation circuit may further comprise:
a first capacitive decoupling circuit connected between the first communication link and the first reference terminal; and
a second capacitive decoupling circuit connected between the second communication link and the second reference terminal.

In one or more embodiments the first communication link may comprise a first-primary-link and a first-secondary-link and the second communication link may comprise a second-primary-link and a second-secondary-link.

In one or more embodiments the first capacitive decoupling circuit may comprise:
a first-primary-decoupling-capacitor connected between the first-primary-link and the first reference terminal; and
a first-secondary-decoupling-capacitor connected between the first-secondary-link and the first reference terminal; and
the second capacitive decoupling circuit may comprise:
a second-primary-decoupling-capacitor connected between the second-primary-link and the second reference terminal; and
a second-secondary-decoupling-capacitor connected between the second-secondary-link and the second reference terminal.

In one or more embodiments the galvanic isolator may comprise a capacitive galvanic isolator. The capacitive galvanic isolator may comprise:
a primary capacitor connected between the first-primary-link and the second-primary-link; and
a secondary capacitor connected between the first-secondary-link and the second-secondary-link.

In one or more embodiments the galvanic isolator may comprise a transformer.

In one or more embodiments the galvanic isolation circuit may have a transceiver-voltage-tolerance-rating and a target BCI requirement defining a sustained current versus frequency relationship. The capacitance value of the AC short capacitor may be selected based on the transceiver-voltage-tolerance-rating and the target BCI requirement.

In one or more embodiments the AC short capacitor may be a discrete capacitor with a capacitance greater than or equal to 100 pF.

There is also provided a communication interface comprising:
a first transceiver;
a second transceiver; and
any galvanic isolation circuit disclosed herein.

In one or more embodiments the communication interface may have a target BCI requirement defining sustained current versus injection frequency and a capacitance value of the AC short capacitor may be selected based on:
a voltage tolerance of the first transceiver;
a voltage tolerance of the second transceiver; and
the target BCI requirement.

According to a further aspect of the present disclosure there is provided a battery management control circuit comprising a plurality of any of the galvanic isolation circuits disclosed herein.

In one or more embodiments the battery management control circuit may further comprise:
a processor comprising a transceiver; and
a plurality of battery management systems, each comprising a first transceiver and a second transceiver;
wherein each of the plurality of galvanic isolation circuits connect adjacent ones of the battery management systems and the processor.

In one or more embodiments a first transceiver of one battery management system, a second transceiver of an adjacent battery management system and one galvanic isolation circuit may form an EMI-filtered galvanically isolated communication interface of the battery management control circuit.

While the disclosure is amenable to various modifications and alternative forms, specifics thereof have been shown by way of example in the drawings and will be described in detail.

It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

A battery management system (BMS) is an electronic system that can monitor electrochemical reactions in battery cells and control the charging and discharging process of each battery cell. To achieve efficient and safe performance, a BMS can also monitor battery temperature and battery health status. In this way, a BMS can bypass defective battery cells and notify a central processing unit (CPU) of the condition of each cell. A BMS may be employed in complex energy storage systems such as hybrid electric vehicles (HEV) and electric vehicles (EV) along with industrial applications, such as energy storage systems (ESS), and uninterruptible power supply (UPS) systems.

Generally, BMS topologies fall into three categories:
1. Centralized: In a centralized topology, a single controller has multiple BMS on the same circuit board (or on a set of closely linked boards). The board is connected to the battery cells, via their respective BMS, by a multitude of wires.
2. Distributed: In a distributed topology, multiple BMS boards are located close to their respective battery cells. The controller is connected to the battery by a single communication cable.
3. Modular: A modular topology comprises a plurality of controllers. Each controller handles a number of battery cells. Communication occurs between the controllers.

In battery pack applications, the high number of battery cells connected in series can generate high voltage potential differences, which demand a high level of component-to-component isolation. A transformer can provide a galvanically isolated communication link between two BMS, each BMS controlling a corresponding battery pack. A transformer can magnetically couple and electrically isolate signals.

Any in-vehicle communication interface is susceptible of exposure to significant electromagnetic (EM) disturbances or electromagnetic interference (EMI), typical to the electrically noisy environment of vehicles. Therefore, galvanic isolation circuits providing communication between BMS can comprise an electromagnetic interference (EMI) filter. Example EMI filters include common mode chokes (CMC) and center-tapped transformers.

Figure 1:
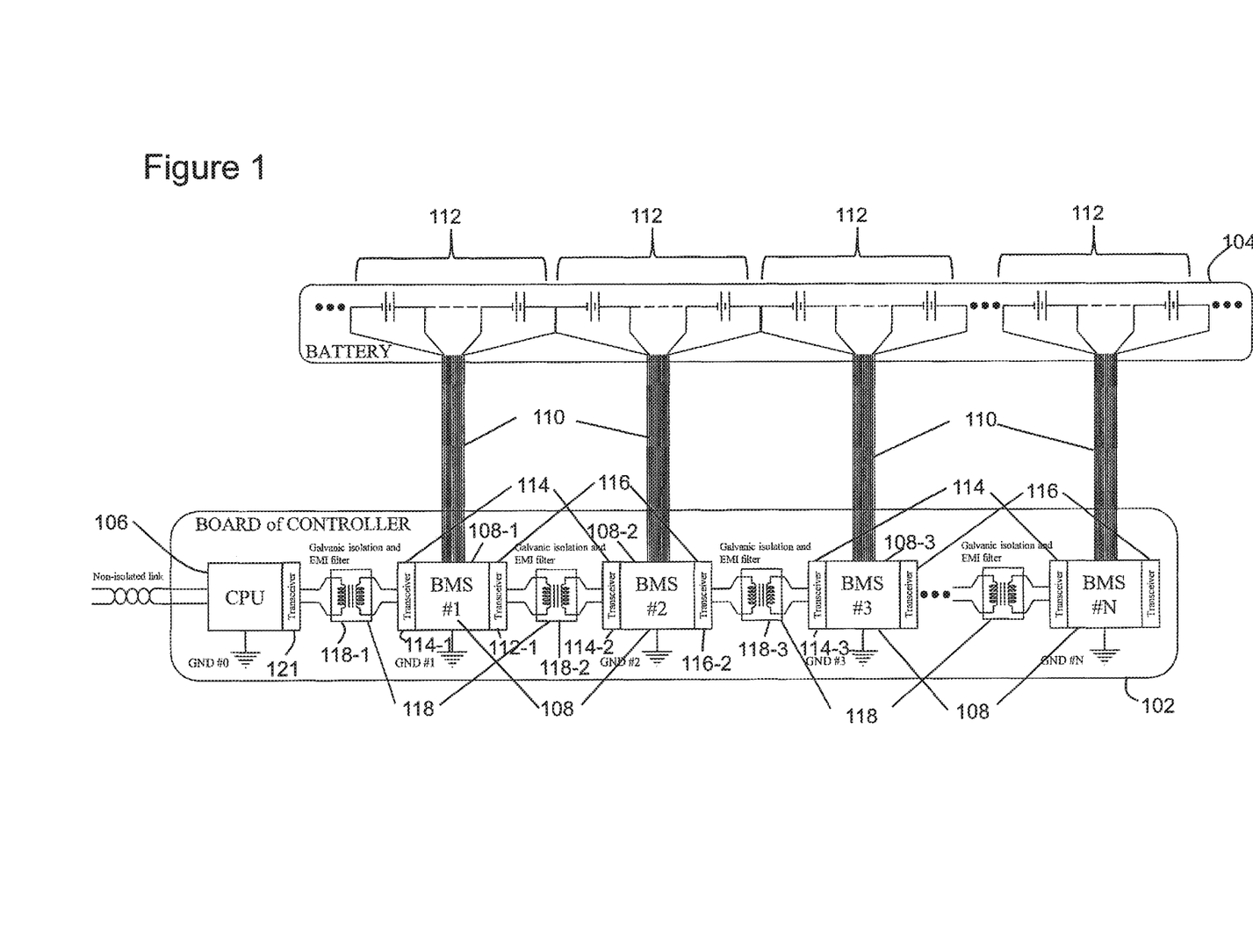
FIG. 1 illustrates a controller board comprising a plurality of battery management systems and connected to a string of battery cells.

FIG. 1 illustrates a controller board 102 connected to a string of battery cells 104. The illustrated controller board 102 can be used in a centralized or modular topology. The controller board comprises a central processing unit (CPU) 106. In some examples the CPU may be a microcontroller. In this example, the CPU is connected to an external higher level control system via a non-isolated link. The controller board further comprises a plurality of BMSs 108 each connected to the string of battery cells 104 via a respective connection cable 110. In some examples, the connection cables 110 may be ribbon cables. Each BMS 108 is connected to a respective substring of battery cells 112 within the string of battery cells 104. Each substring of battery cells 112 may be a modular battery pack.

Each BMS 108 comprises a first transceiver 114 and a second transceiver 116. Each of the plurality of BMS 108 can communicate with their adjacent BMS via their transceivers 114, 116 and intervening galvanic isolation circuits 118. For example, a second transceiver 116-1 of a first BMS 108-1 can communicate with a first transceiver 114-2 of a second BMS 108-2 via a second galvanic isolation circuit 118-2. Similarly, a second transceiver 116-2 of the second BMS 108-2 can communicate with a first transceiver 114-3 of a third BMS 108-3 via a third galvanic isolation circuit 118-3 and so on.

In this example, the CPU 106 also comprises an embedded or a standalone transceiver 121. The transceiver 121 of the CPU 106 can communicate with a first transceiver 114-1 of the first BMS 108-1 via a first galvanic isolation circuit 118-1. In this way, the CPU 106 can communicate with each of the BMS 108 via the galvanic isolation circuits 118. The transceivers 114, 116 of the BMS and the galvanic isolation circuits 118 define a series of communication interfaces interspersed between the series of BMS 108. In this example, the BMS 108 are connected to the CPU 106 in a daisy-chain configuration.

Each galvanic isolation circuit 118 comprises a galvanic isolator. In this example, the galvanic isolators are transformers which provide galvanic isolation between adjacent BMS 108. Adjacent BMS are galvanically isolated from each other in that they do not have a common ground or any other shared reference voltage. As each BMS 108 has a DC connection to the string of battery cells 104, galvanic isolation is necessary to handle the high component to component voltage difference between adjacent BMS 108.

As noted above, transformers can provide galvanic isolation by magnetically coupling and electrically isolating signals. In other examples, the galvanic isolator may comprise one or more capacitors. Capacitors can provide a lower cost galvanic isolator compared to transformers.

In this example, the communication interfaces provided by the galvanic isolation circuits 118 between adjacent BMS 108 are all located on the same board. However, such communication interfaces may be vulnerable to external EMI. The galvanic isolation circuit may further comprise an EMI filter to provide the communication interface with protection from EM disturbances. Standard test methods in the manufacture of electric vehicles can apply such EMI via conduction or radiation. These test methods can verify that a system is sufficiently immune to the EMI. Bulk Current Injection (BCI) is an example of a conducted EMI test in which current is injected to by a cable connection to a battery pack under test.

Figure 2:
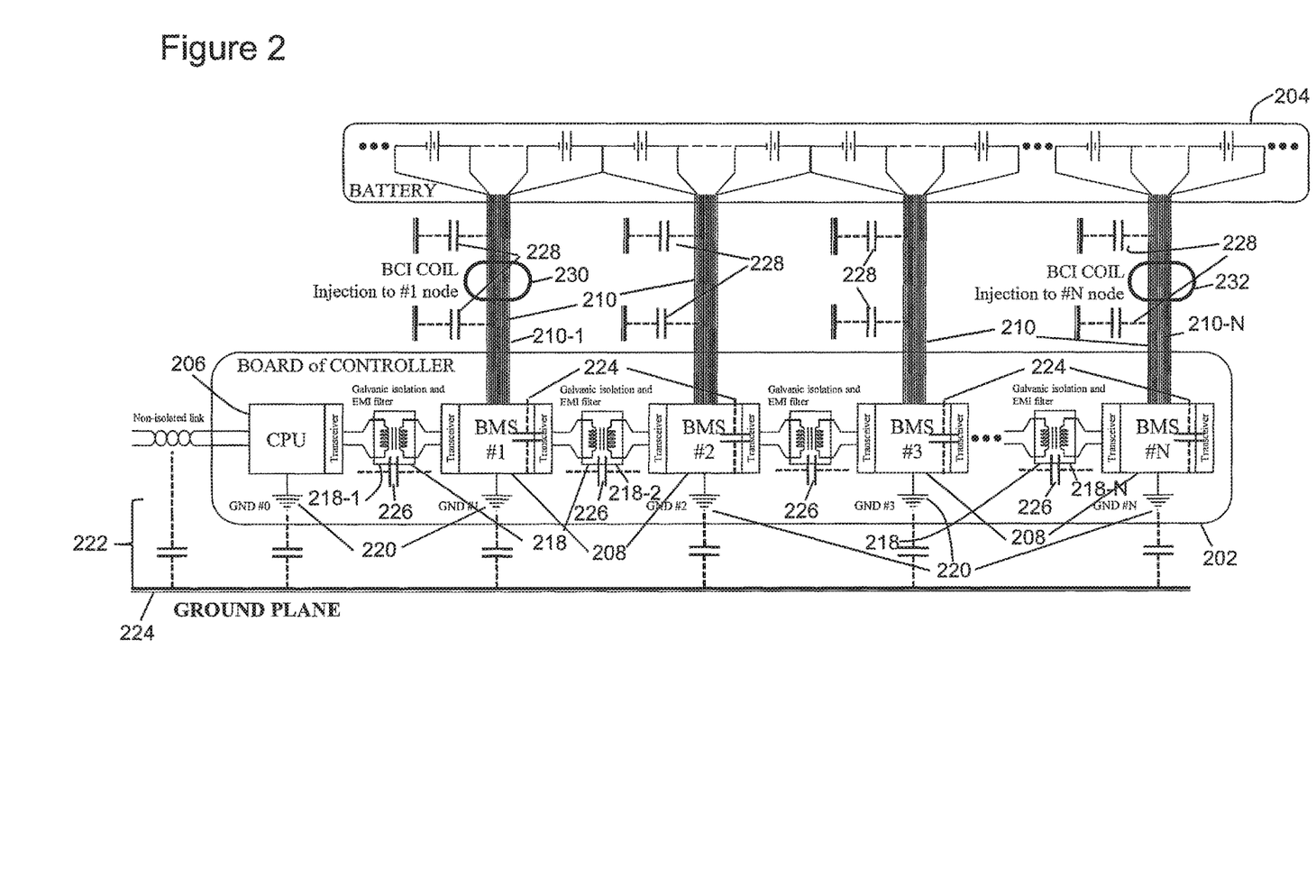
FIG. 2 illustrates the controller board of FIG. 1 undergoing a bulk current injection test.

FIG. 2 illustrates a controller board 202 and a connected string of battery cells 204, similar to those of FIG. 1, undergoing a BCI test. The BCI test may comprise placing an injection coil at a fixed distances along a connection cable 210 and measuring the system response. In some examples, connection cables 210 are approximately 2 metres long and a series of tests are performed with the injection coil placed along a connection cable 210 at distances of 15 cm, 45 cm and 75 cm in turn from the corresponding BMS 208.

The CPU 206 and each BMS 208 are each connected to their own corresponding reference terminal 220. In this way, the CPU 206 and each BMS 208 may each have their own ground connection. The figure illustrates a ground-parasitic-capacitance 222 connecting each reference terminal 220 to a ground plane 224 of the system undergoing a BCI test. The ground-parasitic-capacitance 222 may be in the range of 1 to 5 pF. Other capacitances illustrated in the system of FIG. 2 include:

BMS-capacitance 224—Potentials received by the connection cables 210 are decoupled, via the BMS, to the corresponding reference terminal 220. The BMS-capacitance 224 is on the order of 10 . . . 100 nF.

Galvanic-isolation-capacitance 226—Parasitic capacitance of a galvanic isolation circuit 208 is approximately: (i) 5 to 20 pF for a transformer based galvanic isolation circuit; and (ii) 1 to 10 nF for a capacitor based galvanic isolation circuit.

Connection-cable-capacitance 228—The connection cables 210, having the characteristics of coupled transmission lines with relatively low even mode impedance to the ground plane 224, comprise a distributed capacitance of approximately 600 pF/m.

During the BCI test, the injection coil is placed on a connection cable. The resulting injected current will follow the lowest impedance path via the connection-cable-capacitances 228 to the ground plane 224. For injection at a given connection cable, the current is likely to pass through and/or circulate in the galvanic isolation circuits 218 adjacent to the connected BMS 208. In other words, the injected current passes through the communication interfaces connecting the chain of BMS 208 on the controller board 202. For example, if the BCI injection coil is coupled to the system at a mid-point 230 of a first connection cable 210-1, the resulting current will pass through the first galvanic isolation circuit 218-1 and the second galvanic isolation circuit 218-2. As a further example, when the BCI injection coil is coupled to the system at a mid-point 232 of the last connection cable 210-N, the resulting current may only pass through the last galvanic isolation circuit 218-N. This test configuration can therefore represent the most stringent test configuration of the BCI test, for a galvanic isolation circuit.

The BCI current passing through the galvanic isolation circuits 208 simulates EMI for testing the immunity of the communication link. An example BMI test requirement is to verify sufficient immunity of the communication link to 300 $mA_{rms}$ of injected current. In order to sustain such levels of EMI, the galvanic isolation circuits 208 can comprise EMI filters (discussed in relation to FIG. 3) and/or CPU and BMS transceivers with a high tolerance to EMI (discussed in relation to FIG. 4).

Figure 3:
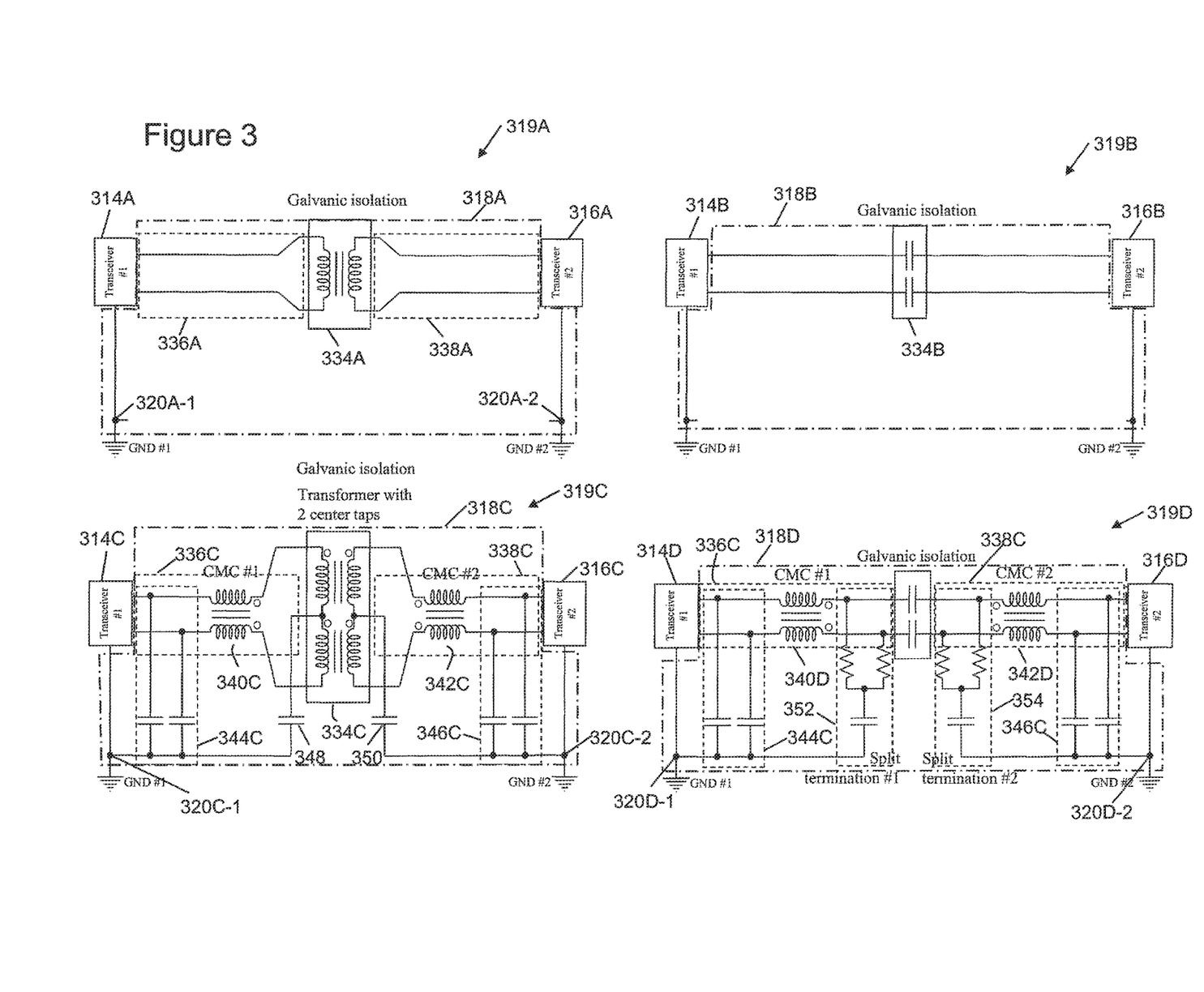
FIG. 3 illustrates example EMI filtering techniques used with both transformer and capacitor based galvanic isolation circuits.

FIG. 3 illustrates example EMI filtering techniques used with both transformer and capacitor based galvanic isolation circuits. The figure illustrates: an unfiltered transformer based communication interface 319A; an unfiltered capacitance based communication interface 319B; an EMI filtered transformer based communication interface 319C; and an EMI filtered capacitance based communication interface 319D.

The unfiltered transformer based communication interface 319A comprises a first transceiver 314A, a second transceiver 316A and an unfiltered transformer based galvanic isolation circuit 318A. The unfiltered transformer based galvanic isolation circuit 318A comprises a galvanic isolator 334A, a first communication link 336A, a second communication link 338A, a first reference terminal 320A-1 and a second reference terminal 320A-2.

The galvanic isolator 334A is located between the first transceiver 314A and the second transceiver 316A. The galvanic isolator 334A is a transformer. The first-transceiver 314A and second transceiver 316A may be one of the BMS transceivers or the transceiver of the CPU. The first receiver 314A is connected to the first reference terminal 320A-1 and the second receiver is connected to the second reference terminal 320A-2. The galvanic isolator 334A is connected to the first transceiver 314A by the first communication link 336A and connected to the second transceiver 316A by the second communication link 338A. In this example, the first and second communication links are dual-line communication links that can communicate via differential signalling.

The unfiltered capacitance based communication interface 319B comprises a first transceiver 314B, a second transceiver 316B and an unfiltered capacitance based galvanic isolation circuit 318B. The unfiltered capacitance based galvanic isolation circuit 318B is identical to the unfiltered transformer based galvanic isolation circuit 318A with the exception that the galvanic isolator 334B comprises a pair of capacitors instead of a transformer.

The EMI filtered transformer based communication interface 319C comprises a first transceiver 314C, a second transceiver 316C and an unfiltered capacitance based galvanic isolation circuit 318C. The EMI filtered transformer based galvanic isolation circuit 318C comprises the same components as described above in relation to the unfiltered transformer based galvanic isolation circuit 318A. In addition, the first and second communication links 336C, 338C comprise a respective first and second common mode choke (CMC) 340C, 342C. The first and second CMCs 340C, 342C comprise a transformer. The circuit 318C further comprises a first capacitive decoupling circuit 344C connected between the first communication link 336C and the first reference terminal 320C-1 and a second capacitive decoupling circuit 346C connected between the second communication link 338C and the second reference terminal 320C-2. The galvanic isolator 334C is a center-tapped transformer with two center taps. A first central terminal of the transformer is connected to the first reference terminal 320C-1 by a first center-tap decoupling capacitor 348. Similarly, a second central terminal of the transformer is connected to the second reference terminal 320C-2 by a second center-tap decoupling capacitor 350.

The EMI filtered capacitance based communication interface 319D comprises a first transceiver 314D, a second transceiver 316D and an unfiltered capacitance based galvanic isolation circuit 318D. The EMI filtered capacitance based galvanic isolation circuit 318D comprises the same components as described above in relation to the unfiltered capacitance based galvanic isolation circuit 318B. In addition, the circuit 318D further comprises a first and second CMC 340D, 342D and a first and second capacitive decoupling circuit 344D, 346D arranged in the same manner as described in relation to the EMI filtered transformer based galvanic isolation circuit 318C. The circuit 318D further comprises a first split-termination circuit 352 coupled between the first communication link 336D and the first reference terminal 320D-1. The first split-termination circuit 352 is connected to the first communication link 336D between the first CMC 340D and the galvanic isolator 334D. The circuit 318D further comprises a second split-termination circuit 354 coupled between the second communication link 338D and the second reference terminal 320D-2. The second split-termination circuit 354 is connected to the second communication link 338D between the second CMC 342D and the galvanic isolator 334D.

The EMI filtered circuits 318C, 318D can attenuate EMI in the form of common mode noise to a safe and manageable level. However, the additional components of the EMI filtered circuits 318C, 318D relative to the corresponding unfiltered circuits 318A, 318B can add significant cost and complexity to a galvanic isolation circuit. In particular, solutions employing transformers can be particularly expensive. Therefore, systems employing multiple galvanic isolation circuits, such as those of FIGS. 1 and 2, can become prohibitively expensive and complex and comprise a large number of components.

Figure 4:
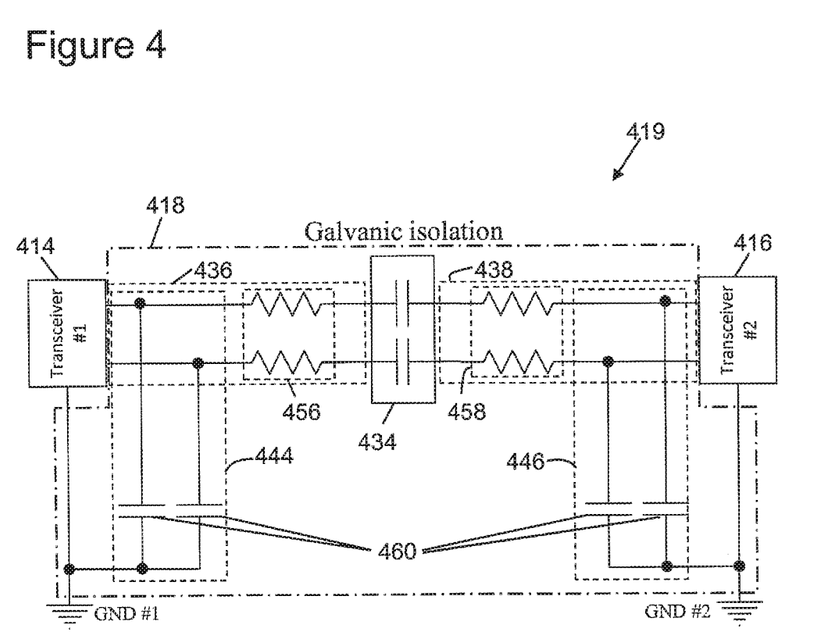
FIG. 4 illustrates an example of a capacitor based communication interface with high voltage tolerant transceivers.

FIG. 4 illustrates an example of a capacitor based communication interface 419 with high voltage tolerant transceivers 414, 416. The high voltage tolerant transceivers 414, 416 enable the use of reduced EMI filtering in an intervening galvanic isolation circuit 418, relative to the EMI filtered galvanic isolation circuits of FIG. 3.

The reduced EMI filtered capacitance based communication interface 419 comprises a first transceiver 414, a second transceiver 416 and a reduced EMI filtered capacitance based galvanic isolation circuit 418. The reduced EMI filtered capacitance based galvanic isolation circuit 418 of FIG. 4 comprises the same components as described above in relation to the unfiltered capacitance based galvanic isolation circuit 318B of FIG. 3. In addition, the circuit 418 of FIG. 4 further comprises a first and second capacitive decoupling circuit 444, 446 arranged in the same manner as described in relation to the EMI filtered transformer based galvanic isolation circuit. The first communication link 436 further comprises a first resistance circuit 456 arranged between the first capacitive decoupling circuit 444 and the galvanic isolator 434. Similarly, the second communication link 438 further comprises a second resistance circuit 458 arranged between the second capacitive decoupling circuit 446 and the galvanic isolator 434.

The first and second capacitive decoupling circuits 444, 446 are the main mechanism for supressing EMI/common mode disturbance in the reduced EMI filtered capacitance based galvanic isolation circuit 418. The impedance of decoupling capacitors 460 of the first and second capacitive decoupling circuits 444, 446 should be high enough to limit BCI current to voltage conversion at the transceiver terminals to less than a maximum voltage rating or tolerance of the transceiver. Circuit design therefore requires a trade-off between decoupling capacitance values and transceiver voltage tolerance.

In one example, a combination of: (i) transceivers 414, 416 with a voltage tolerance of ±40 V; and (ii) decoupling capacitors 460 each with a capacitance of 100 pF, can satisfy a 300 $mA_{rms}$ injected BCI current requirement at a frequency of 10 MHz. A transceiver 444, 446 with a voltage tolerance of ±40 V can be at the limit of semiconductor technologies used for automotive products. The required ±40V tolerant bi-direction switches can require a large silicon area and have high capacitances with resulting high switching loss and consumption.

If the communication interface 419 of FIG. 4 employs transceivers 414, 416 with a voltage tolerance of less than ±40V, corresponding higher capacitance values for the decoupling capacitors 460 will be required. Capacitance values higher than 100 pF can result in extra current consumption due to switching loss. Higher value decoupling capacitors can also generate a low pass filter (LPF) for any communication signal. This can limit the communication speed.

Embodiments of the present disclosure that are described below provide a circuit arrangement that can reduce EMI immunity requirements of transceivers and EMI filter circuitries. This in turn can reduce the number and cost of external components and avoid primary performance degradation of the communication interface caused by excessive filtering.

Figure 5:
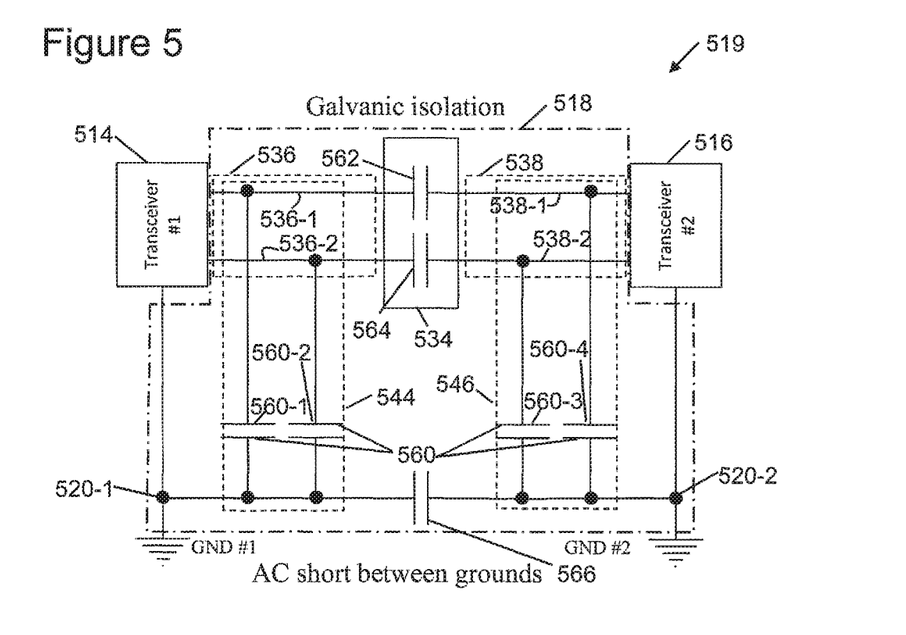
FIG. 5 illustrates a communication interface comprising a capacitance based galvanic isolation circuit according to an embodiment of the present disclosure.

FIG. 5 illustrates a communication interface 519 comprising a galvanic isolation circuit 518 according to an embodiment of the present disclosure. The galvanic isolation circuit 518 of FIG. 5 can advantageously: (i) reduce the complexity and component requirements of EMI filter circuitry; and (ii) reduce the voltage tolerance requirements of the transceivers.

The communication interface 519 of FIG. 5 comprises a first transceiver 514, a second transceiver 516 and a galvanic isolation circuit 518. The galvanic isolation circuit 518 comprises a galvanic isolator 534, a first communication link 536, a second communication link 538, a first reference terminal 520-1 and a second reference terminal 520-2.

The galvanic isolator 534 has a first side and a second side, with each side being isolated from the other side. In this example, the galvanic isolator 534 comprises a first isolating capacitor 562 and a second isolating capacitor 564. The first communication link 536 connects the first side of the galvanic isolator 534 to the first transceiver 514. Similarly, the second communication link 538 connects the second side of the galvanic isolator 534 to the second receiver 516. In this way, the first and second transceivers can communicate with one another in a galvanically isolated manner. For example, the transceivers may belong to adjacent BMS and/or the CPU in the controller boards of FIGS. 1 and 2.

The galvanic isolation circuit 518 further comprises an AC short capacitor 566 connected between the first reference terminal 520-1 and the second reference terminal 520-2.

The AC short capacitor 566 provides an EMI filtering mechanism for the galvanic isolation circuit 518. As discussed further below, the AC short capacitor 566 can create a lower impedance path, between the first reference terminal 520-1 and the second reference terminal 520-2, in parallel to the galvanic isolator 534. In this way, the bulk of any EMI current will flow through the AC short capacitor 566.

The AC short capacitor 566 is a discrete capacitor, which may be in the range of 100 pF to 100 nF. The AC short capacitor 566 is not a parasitic capacitance.

In this example, the galvanic isolation circuit 518 also comprises: a first capacitive decoupling circuit 544 connected between the first communication link 536 and the first reference terminal 520-1; and a second capacitive decoupling circuit 546 connected between the second communication link 538 and the second reference terminal 520-2. In a similar manner to the EMI filtered circuits 318C, 318D, 418 of FIGS. 3 and 4, the first and second capacitive decoupling circuits 544, 546 can provide EMI filtering for the galvanic isolation circuit 518.

The arrangement of the AC short capacitor 566 between the reference terminals 520-1, 520-2 of two galvanically isolated transceivers creates a low impedance path for AC signals. This can determine a maximum magnitude of AC voltage between the reference terminals 520-1, 520-2, and in turn a magnitude of common mode AC voltage that will affect the communication interface operation for injected AC current disturbances. This relaxes the requirements of any additional EMI filter circuitry (such as the capacitive decoupling circuits 544, 546) and the voltage tolerance requirements of the interface transceivers 514, 516. This enables the use of simple EMI filter circuitry comprising low cost components and avoids excessive filtering that can limit the performance of the communication interface.

In the communication interface 519, the capacitance values of decoupling capacitors 560 of the first and second capacitive decoupling circuits 544, 546 and the voltage tolerance of the first and second transceivers 514, 516 can be relaxed relative to their constrained values in the communication interface of FIG. 4. For example, the capacitance $C_{DECOUPLING}$ of the decoupling capacitors can be reduced or minimised enabling higher speed communication. In some embodiments, such as in FIG. 6, the decoupling capacitors can be omitted. Similarly, the galvanic isolation circuit 518 can be used with transceivers having lower voltage tolerance than those discussed in relation to the communication interface of FIG. 4.

The communication interface 519 will have sufficient EMI filtering if the capacitance $C_{AC\text{-}SHORT}$ of the AC short capacitor 566 is selected to satisfy the condition:

$$V_{CM,MAX} \geq \frac{I_{BCI}}{\left(2\pi f_{BCI} \cdot \left(2 \cdot \frac{C_{ISOLATION} \cdot C_{DECOUPLING}}{C_{ISOLATION} + C_{DECOUPLING}} + C_{AC\ SHORT}\right)\right)}$$

$$V_{CM,MAX} \geq \frac{I_{BCI}}{(2\pi f_{BCI} \cdot C_{AC\ SHORT})}$$

as and $C_{ISOLATION} \gg C_{DECOUPLING}$ and $C_{AC\ SHORT} \gg C_{DECOUPLING}$
where:

$C_{ISOLATION}$ is the capacitance of the capacitance based galvanic isolator 534;

$V_{CM,MAX}$ is the voltage tolerance of the transceivers 514, 516 (the maximum common mode voltage amplitude tolerable by transceiver design or its external protection or the maximum common mode voltage enabling faultless communication at signal transmission or reception);

$I_{BCI}$ is the maximum sustained current at the frequency of injection $f_{BCI}$. A target BCI requirement defining a relationship between sustained $I_{BCI}$ and $f_{BCI}$ is normally described by a certain profile, current versus frequency, as a requirement of BCI testing. The profile of the target BCI requirement may have a non-linear curvature.

In the above inequality, it is assumed that one of the capacitive decoupling circuits 544, 546 (i.e. one pair of decoupling capacitors 560) is shorted by lower impedance during a driver operation of the corresponding transceiver 514, 516.

Therefore, for the communication interface 519 comprising the galvanic isolation circuit 518 with the AC short capacitor 566, it is not necessary for the transceivers 514, 516 to have a high voltage tolerance, e.g. ±40 V or for the decoupling capacitors 560 to have a high capacitance value. As a result, the galvanic isolation circuit 518 can enable high-speed communication, not limited by low saturation current and/or by high parasitic capacitance of high voltage devices inside the transceiver and/or excessive external filtering. The AC short capacitor 566 simplifies the EMI filter design for the galvanic isolation circuit 518 and the capacitance value of the AC short capacitor 566 can be selected using the above inequality.

Figure 6:
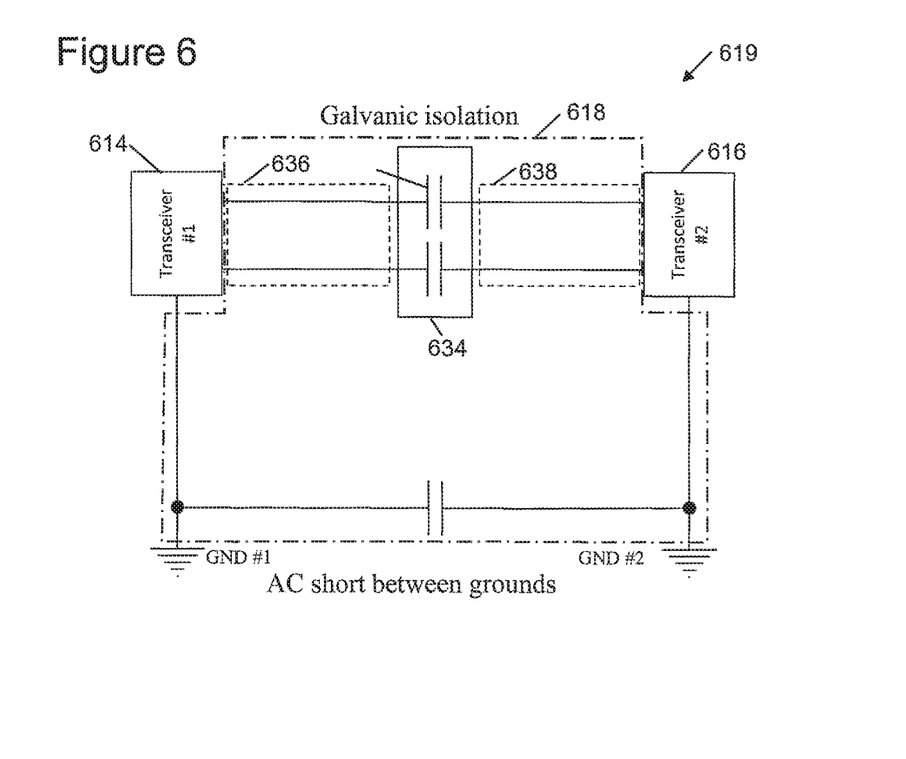
FIG. 6 illustrates a communication interface comprising a capacitance based galvanic isolation circuit according to an embodiment of the present disclosure, without capacitive decoupling circuits.

FIG. 6 illustrates a further communication interface 619 comprising a galvanic isolation circuit 618 according to an embodiment of the present disclosure. Features of FIG. 5 that are also shown in FIG. 6 have been given corresponding reference numbers in the 600 series and will not necessarily be described again here.

The galvanic isolation circuit 618 is identical to the galvanic isolation circuit of FIG. 5, with the exception that there are no capacitive decoupling circuits. The inequalities above demonstrate that the capacitance of the capacitive decoupling circuits can become negligible when considering the performance of the galvanic isolation circuit of FIG. 5. As a result, some embodiments of the present disclosure do not comprise a capacitive decoupling circuit.

Figure 7:
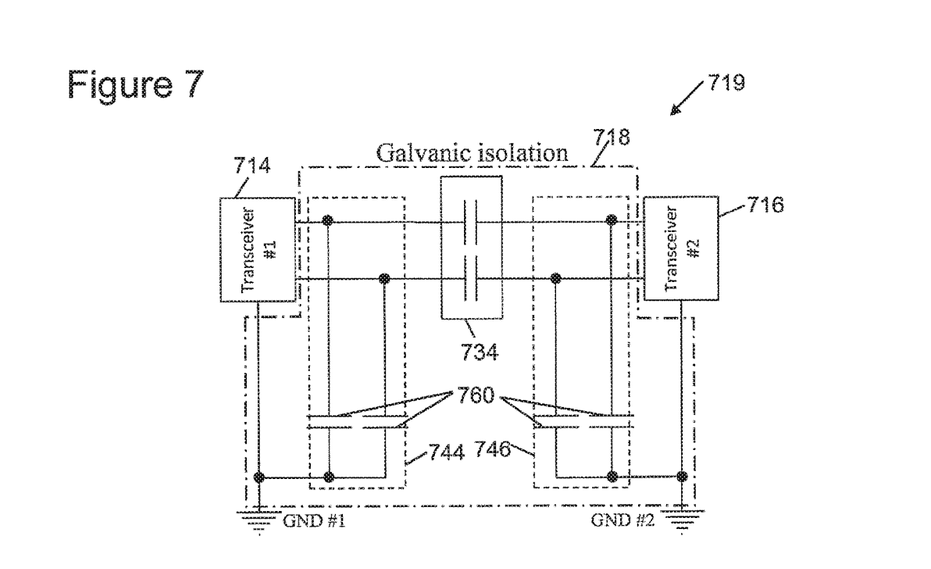
FIG. 7 illustrates the performance of a communication interface without an AC short capacitor.
Figure 8:
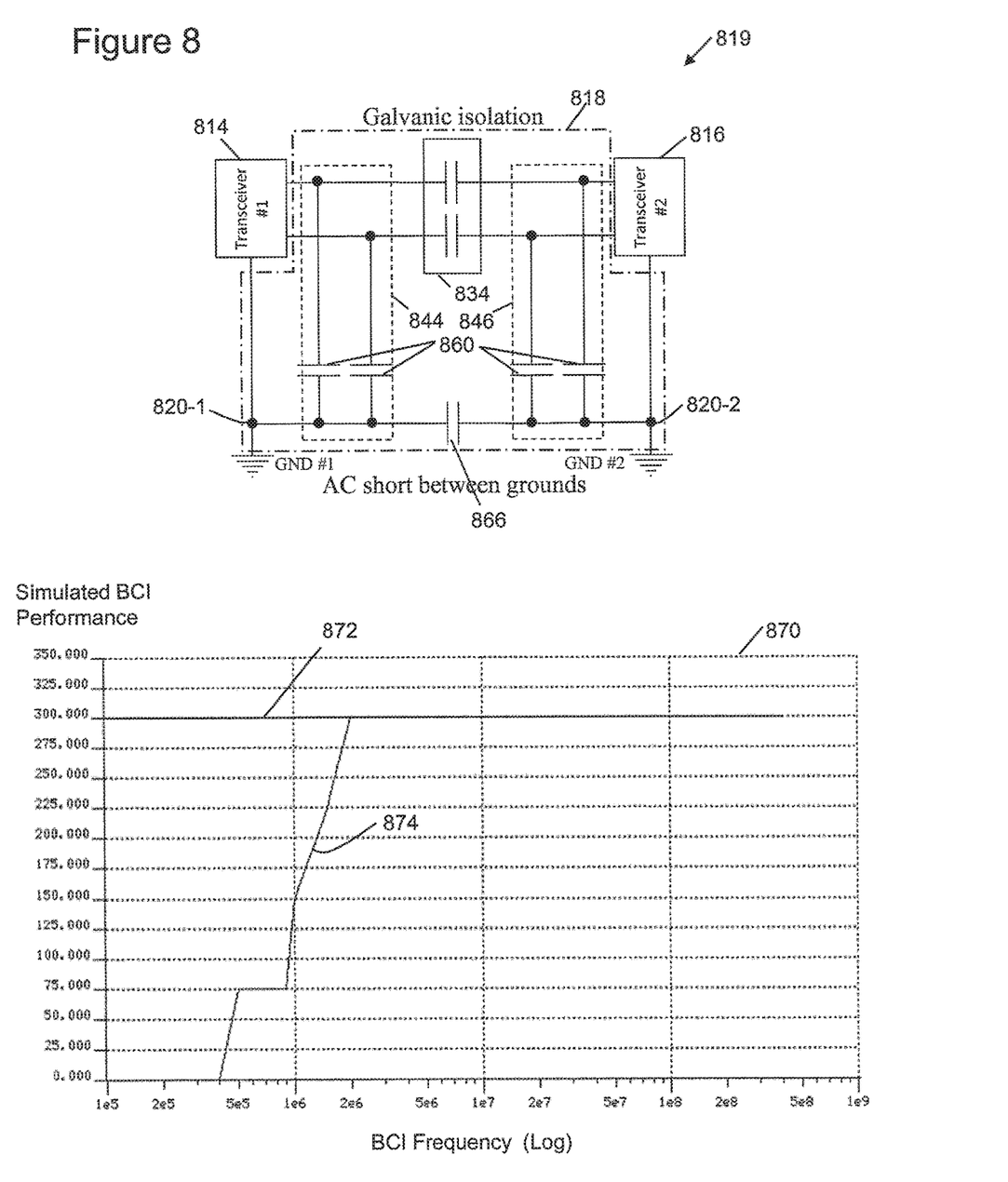
FIG. 8 illustrates the performance of a communication interface with an AC short capacitor according to an embodiment of the present disclosure.

FIGS. 7 and 8 compare the performance of example communication interfaces 719, 819 comprising galvanic isolation circuits 718, 818 with and without an AC short capacitor. FIG. 7 illustrates the performance of a communication interface 719 without an AC short capacitor and FIG. 8 illustrates the performance of a communication interface 819 with an AC short capacitor 866 connected between a first reference terminal 820-1 and a second reference terminal 820-2. The figures contain plots 770, 870 illustrating the simulated BCI performance of the respective communication interface 719, 819. BCI frequency is plotted on the horizontal axis with sustained BCI current on the vertical axis.

The galvanic isolation circuits 718, 818 of FIGS. 7 and 8 are identical with the exception of the AC short capacitor 866. The AC short capacitor 866 is a 5 nF capacitor. Each galvanic isolation circuit 718, 818 comprises: a galvanic isolator 734, 834 comprising two 5 nF capacitors; and first and second capacitive decoupling circuits 744, 746, 844, 846 each decoupling circuit comprising two 22 pF decoupling capacitors 760, 860. First and second transceivers 714, 716, 814, 816 of the communication interfaces 719, 819 each have a voltage tolerance of ±10 V.

The plots 770, 870 illustrate a target BCI requirement 772, 872 of 300 mA$_{rms}$ sustained BCI current across a frequency range from 100 kHz to 400 MHz. In some examples, the target BCI requirement may have a more complex relationship between sustained BCI current and BCI injection frequency. Simulated performance curves 774, 874 on the plots 770, 870 show simulated performance or a value of maximum sustained current, at which communication is still faultless (or at least sufficiently interference free). The plot 770 of FIG. 7 for the communication interface 719 without an AC short capacitor shows that the performance curve 774 is below the target BCI requirement 772 for frequencies less than 100 MHz. In other words, the communication interface 719 has a minimum-EMI-filtered-frequency of 100 MHz. Therefore, the capacitive decoupling circuits 744, 746 alone do not demonstrate immunity to 300 mA$_{rms}$ BCI injection current.

The plot 870 of FIG. 8 for the communication interface 819 comprising the galvanic isolation circuit 818 with the AC short capacitor 866 shows that the performance curve 874 can meet the target BCI requirement 872 for frequencies down to approximately 1 MHz. The immunity performance of the galvanic isolation circuit 818 with the AC short capacitor 866 demonstrates an improvement in EMI filtering performance of two orders of magnitude relative to the galvanic isolation circuit 718 of FIG. 7.

In this example, the 5 nF AC short capacitor 866 is not sufficient for the communication interface 819 to meet the 300 mA$_{rms}$ requirement at frequencies less than 1 MHz. In other words, the communication interface 819 has a minimum-EMI-filtered-frequency of 1 MHz. The value of the AC short capacitor 866 can be increased to extend the communication interface performance to lower frequencies by lowering the minimum-EMI-filtered-frequency. However, many applications do not require this level of performance at such low frequencies. Furthermore, for various reasons, such as power limitation of a closed loop or too high impedance at low frequencies for open loop BCI injection, it can be challenging to meet the 300 mA$_{rms}$ requirement at low frequencies.

Figure 9:
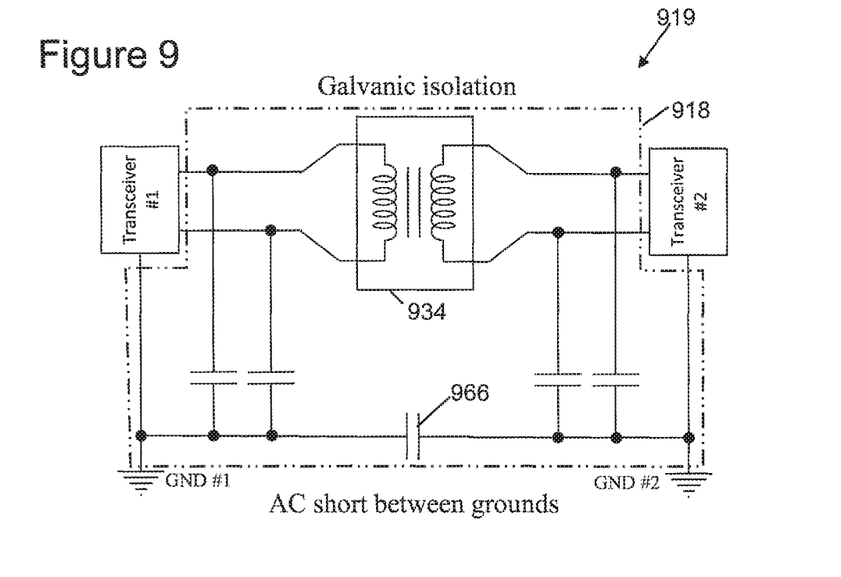
FIG. 9 illustrates a communication interface comprising a transformer based galvanic isolation circuit according to an embodiment of the present disclosure.

FIG. 9 illustrates a communication interface 919 comprising a transformer based galvanic isolation circuit 918 according to an embodiment of the present disclosure. Features of FIG. 5 that are also shown in FIG. 9 have been given corresponding reference numbers in the 900 series and will not necessarily be described again here.

FIG. 9 is identical to FIG. 5 with the exception that the galvanic isolator 934 is a transformer instead of comprising capacitors. The AC short capacitor 966 works in the same way as described in relation to FIG. 5. The transformer based galvanic isolation circuit 918 can also provide sufficient EMI filtering without demanding constraints on the transceiver voltage tolerance or the decoupling capacitance. However, the transformer based solution is not as cost-effective as the capacitor based communication interfaces of FIGS. 5 and 6. The galvanic isolation circuit 918 of FIG. 9 includes first and second capacitive decoupling circuits 944, 946. The decoupling circuits are optional and other embodiments of the transformer based galvanic isolation circuit may operate without the decoupling circuits in a similar manner to the capacitive based circuit of FIG. 6.

The galvanic isolation circuits disclosed in relation to FIGS. 5, 6, 8 and 9 comprise dual-line communication links which can communicate via differential signalling. Referring to FIG. 5 as an example, the dual line circuit is comprised as follows. The first communication link 536 comprises a first-primary-link 536-1 and a first-secondary-link 536-2; and the second communication link 538 comprises a second-primary-link 538-1 and a second-secondary-link 538-2. In the example of FIG. 5, the first capacitive decoupling circuit 544 comprises: a first-primary-decoupling-capacitor 560-1 connected between the first-primary-link 536-1 and the first reference terminal 520-1; and a first-secondary-decoupling-capacitor 560-2 connected between the first-secondary-link 536-2 and the first reference terminal 520-2. Similarly, the second capacitive decoupling circuit 546 comprises: a second-primary-decoupling-capacitor 560-3 connected between the second-primary-link 538-1 and the second reference terminal 520-2; and a second-secondary-decoupling-capacitor 560-4 connected between the second- secondary-link 538-2 and the second reference terminal 520-2.

In other example embodiments, the first and second communication links and the first and second capacitive decoupling circuits may consist of respective single links or single capacitors, in a single-line configuration.

The use of an AC short capacitor maintains galvanic isolation between the BMS. This can be considered advantageous when compared with an alternative approach of replacing the AC short capacitor with a direct DC connection between the highest voltage of the first BMS and the reference terminal of the second BMSs, as example, using the fact that BMSs are connected to the string of battery cells in predefined order. Implementing this approach in the controller boards of FIG. 1 and FIG. 2 would enable direct on the board connections of the maximum potential incoming from the battery to the reference terminals of adjacent BMS. However, connection to the battery in the wrong order would create a significant hazard that could injure a user. A different set of connectors may mitigate such risk. Nonetheless, due to the potential hazard, this approach may not be acceptable for many BMS applications.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed:

1. A galvanic isolation circuit comprising:
a galvanic isolator having a first side and a second side;
a first communication link connected to the first side of the galvanic isolator and connectable to a first transceiver;
a second communication link connected to the second side of the galvanic isolator and connectable to a second transceiver;
a first reference terminal connectable to the first transceiver;
a second reference terminal connectable to the second transceiver; and
an AC short capacitor connected between the first reference terminal and the second reference terminal, wherein the galvanic isolation circuit has a transceiver-voltage-tolerance-rating and a target BCI requirement defining a sustained current versus frequency relationship, and wherein a capacitance value of the AC short capacitor is based on the transceiver-voltage-tolerance-rating and the target BCI requirement.

2. The galvanic isolation circuit of claim 1, wherein the AC short capacitor is a discrete capacitor.

3. The galvanic isolation circuit of claim 1 further comprising:
a first capacitive decoupling circuit connected between the first communication link and the first reference terminal; and
a second capacitive decoupling circuit connected between the second communication link and the second reference terminal.

4. The galvanic isolation circuit of claim 3, wherein:
the first communication link comprises a first-primary-link and a first-secondary-link; and
the second communication link comprises a second-primary-link and a second-secondary-link;
the first capacitive decoupling circuit comprises:
   a first-primary-decoupling-capacitor connected between the first-primary-link and the first reference terminal; and
   a first-secondary-decoupling-capacitor connected between the first-secondary-link and the first reference terminal; and
the second capacitive decoupling circuit comprises:
   a second-primary-decoupling-capacitor connected between the second-primary-link and the second reference terminal; and
   a second-secondary-decoupling-capacitor connected between the second-secondary-link and the second reference terminal.

5. The galvanic isolation circuit of claim 1, wherein the galvanic isolator comprises a capacitive galvanic isolator.

6. The galvanic isolation circuit of claim 4, wherein the capacitive galvanic isolator comprises:
a primary capacitor connected between the first-primary-link and the second-primary-link; and
a secondary capacitor connected between the first-secondary-link and the second-secondary-link.

7. The galvanic isolation circuit of claim 1, wherein the galvanic isolator comprises a transformer.

8. The galvanic isolation circuit of claim 1, wherein the AC short capacitor is a discrete capacitor with a capacitance greater than or equal to 100 pF.

9. A communication interface comprising:
a first transceiver;
a second transceiver; and
a galvanic isolation circuit comprising:
   a galvanic isolator having a first side and a second side;
   a first communication link connected to the first side of the galvanic isolator and connectable to a first transceiver;
   a second communication link connected to the second side of the galvanic isolator and connectable to a second transceiver;
   a first reference terminal connectable to the first transceiver;
   a second reference terminal connectable to the second transceiver; and
   an AC short capacitor connected between the first reference terminal and the second reference terminal, wherein the communication interface has a target BCI requirement defining sustained current versus injection frequency and wherein a capacitance value of the AC short capacitor is selected based on:
     a voltage tolerance of the first transceiver;
     a voltage tolerance of the second transceiver; and
     the target BCI requirement.

10. The communication interface of claim 9, wherein the AC short capacitor is a discrete capacitor.

11. The communication interface of claim 9, wherein the galvanic isolator comprises a capacitive galvanic isolator.

12. A battery management control circuit comprising a plurality of galvanic isolation circuits, each galvanic isolation circuit comprising:
a galvanic isolator having a first side and a second side;
a first communication link connected to the first side of the galvanic isolator and connectable to a first transceiver;
a second communication link connected to the second side of the galvanic isolator and connectable to a second transceiver;
a first reference terminal connectable to the first transceiver;
a second reference terminal connectable to the second transceiver;
an AC short capacitor connected between the first reference terminal and the second reference terminal;
a processor comprising a transceiver; and
a plurality of battery management systems, each comprising a first transceiver and a second transceiver;
wherein each of the plurality of galvanic isolation circuits connect adjacent ones of the battery management systems and the processor, wherein a first transceiver of one battery management system, a second transceiver of an adjacent battery management system and one galvanic isolation circuit form an EMI-filtered galvanically isolated communication interface.

* * * * *